(12) United States Patent  
Suetsugu

(10) Patent No.: US 8,125,877 B2  
(45) Date of Patent: Feb. 28, 2012

(54) OPTICAL PICKUP

(75) Inventor: Masaaki Suetsugu, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 167 days.

(21) Appl. No.: 12/330,571

(22) Filed: Dec. 9, 2008

(65) Prior Publication Data

US 2009/0168638 A1    Jul. 2, 2009

(30) Foreign Application Priority Data

Dec. 27, 2007 (JP) ................................. 2007-336037

(51) Int. Cl.
*G11B 7/00* (2006.01)

(52) U.S. Cl. ................. 369/121; 369/112.01; 369/44.11

(58) Field of Classification Search ............... 369/244.1, 369/112.05, 121, 112.01, 44.11, 44.12, 44.14; 720/658, 648; 385/88; 359/819; 250/214
See application file for complete search history.

(56) References Cited

U.S. PATENT DOCUMENTS

| 6,025,963 | A   | 2/2000  | Hippenmeyer et al. |
| 6,410,904 | B1  | 6/2002  | Ito et al. |
| 7,206,273 | B2* | 4/2007  | Sogawa et al. ............ 369/100 |
| 7,507,033 | B2* | 3/2009  | Tanabe ....................... 385/88 |
| 7,782,736 | B2* | 8/2010  | Suetsugu ................ 369/112.05 |
| 7,890,967 | B2* | 2/2011  | Toyoda et al. .............. 720/649 |
| 2003/0043728 | A1* | 3/2003 | Kan et al. .................. 369/244 |
| 2004/0218501 | A1* | 11/2004 | Sogawa et al. ............. 369/99 |
| 2007/0115615 | A1  | 5/2007  | Hamatani |

FOREIGN PATENT DOCUMENTS

| EP | 1 688 936 A1 | 8/2006 |
| JP | 09-274124 A  | 10/1997 |
| JP | 2005-190572 A | 7/2005 |
| JP | 2006-156557 A | 6/2006 |

\* cited by examiner

*Primary Examiner* — Thang Tran  
*Assistant Examiner* — Linh Nguyen  
(74) *Attorney, Agent, or Firm* — Global IP Counselors

(57) ABSTRACT

An optical pickup includes a light emitting component, an optical component and a base component. The light emitting component has a laser diode, a package and a holder. The package has a positioning recess formed in an outer peripheral face of the package. The holder holds the package in a fitting hole of the holder. The holder has a protrusion component that is formed in an inner peripheral face of the fitting hole of the holder and is fitted to the positioning recess of the package, and a guide component that extends from the protrusion component by a first specific height beyond an end face of the holder. The protrusion component has a width in a peripheral direction of the fitting hole that is at least equal to a width of the positioning recess of the package in a peripheral direction of the package.

12 Claims, 6 Drawing Sheets

OPTICAL PICKUP

CROSS-REFERENCE TO RELATED APPLICATIONS

This application claims priority to Japanese Patent Application No. 2007-336037 filed on Dec. 27, 2007. The entire disclosure of Japanese Patent Application No. 2007-336037 is hereby incorporated herein by reference.

BACKGROUND OF THE INVENTION

1. Field of the Invention

The present invention generally relates to an optical pickup. More specifically, the present invention relates to an optical pickup having a laser diode.

2. Background Information

A conventional laser diode for an optical pickup is housed in a package with a positioning recess (see Japanese Laid-Open Patent Application Publication No. 2005-190572, for example). The positioning recess of the package is fitted with respect to a positioning protrusion formed on a holder for supporting the package to position the laser diode with respect to the holder.

With the conventional laser diode, since the positioning protrusion is fitted into the positioning recess, there is a component clearance between the positioning protrusion and the positioning recess. However, the component clearance causes the positioning protrusion to be irregularly positioned with respect to the positioning recess, either in a neutral position, turned to the left, or turned to the right. Thus, positioning accuracy of the package with respect to the holder is not consistent, which results in variance in the position where the laser diode is fixed. Consequently, when laser beam is projected from the laser diode and the laser light is reflected by an optical disk, the amount of the laser light received by a reading element of the optical pickup is increased or decreased compared to a setting value. As a result, characteristics of the optical pickup become unstable.

In view of the above, it will be apparent to those skilled in the art from this disclosure that there exists a need for an improved optical pickup. This invention addresses this need in the art as well as other needs, which will become apparent to those skilled in the art from this disclosure.

SUMMARY OF THE INVENTION

The present invention is conceived in light of the above-mentioned problems. One object of the present invention is to provide an optical pickup in which a laser diode is accurately positioned to a holder.

In accordance with one aspect of the present invention, an optical pickup includes a light emitting component, an optical component and a base component. The light emitting component has a laser diode, a package and a holder. The laser diode is configured to emit light. The package houses the laser diode. The package has a positioning recess formed in an outer peripheral face of the package. The holder holds the package in a fitting hole of the holder. The holder has a protrusion component that is formed in an inner peripheral face of the fitting hole of the holder and is fitted to the positioning recess of the package to position the package with respect to the holder, and a guide component that extends from the protrusion component by a first specific height beyond an end face of the holder. The protrusion component has a width in a peripheral direction of the fitting hole that is at least equal to a width of the positioning recess of the package in a peripheral direction of the package. The optical component is arranged to guide the light emitted by the light emitting component to a disk and receive the light reflected on the disk. The base component is arranged to support the light emitting component and the optical component.

With the optical pickup, it is possible to provide an optical pickup in which a laser diode is accurately positioned to a holder.

These and other objects, features, aspects and advantages of the present invention will become apparent to those skilled in the art from the following detailed descriptions, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENT

A preferred embodiment of the present invention will now be explained with reference to the drawings. It will be apparent to those skilled in the art from this disclosure that the following description of the preferred embodiment of the present invention is provided for illustration only and not for the purpose of limiting the invention as defined by the appended claims and their equivalents.

Figure 5A:
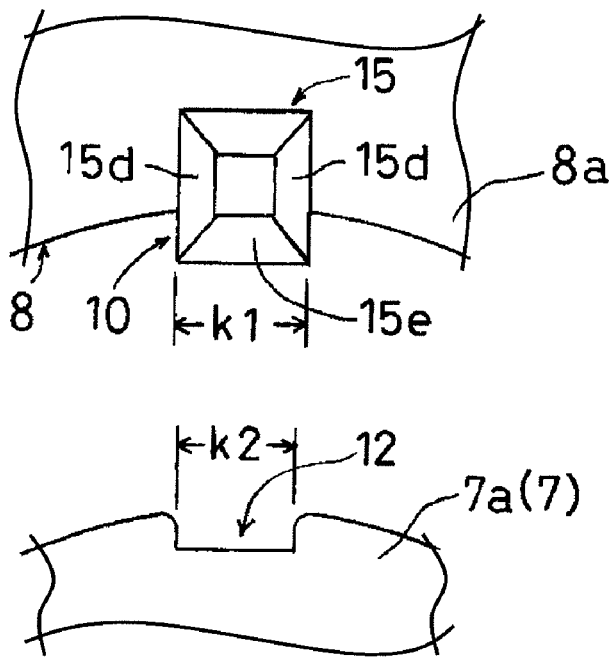
FIG. 5A is a detail front elevational view of the light emitter illustrated in FIG. 1.
Figure 5B:
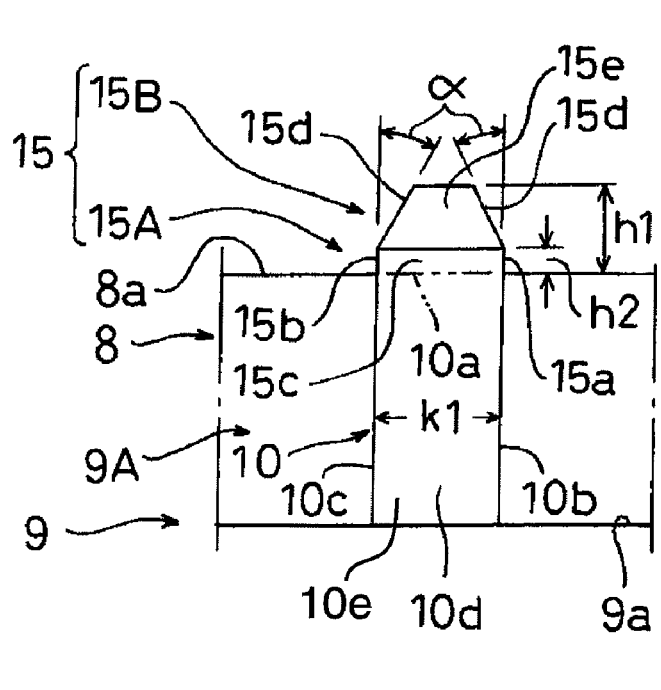
FIG. 5B is a detail plan view of the light emitter illustrated in FIG. 1.
Figure 5C:
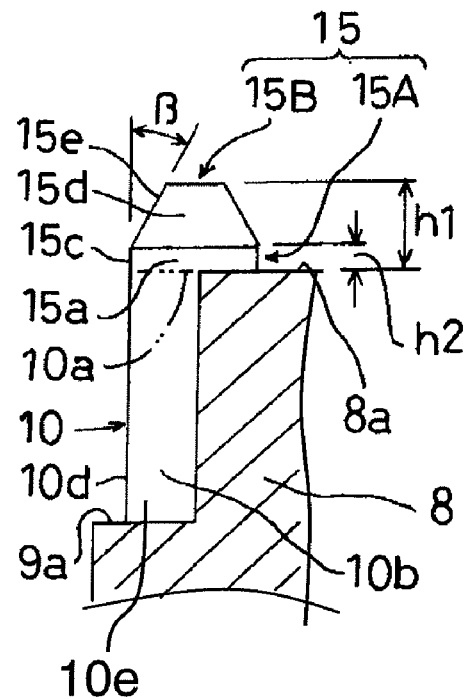
FIG. 5C is a detail cross sectional view of the light emitter taken along VC-VC line illustrated in FIG. 4.
Figure 6:
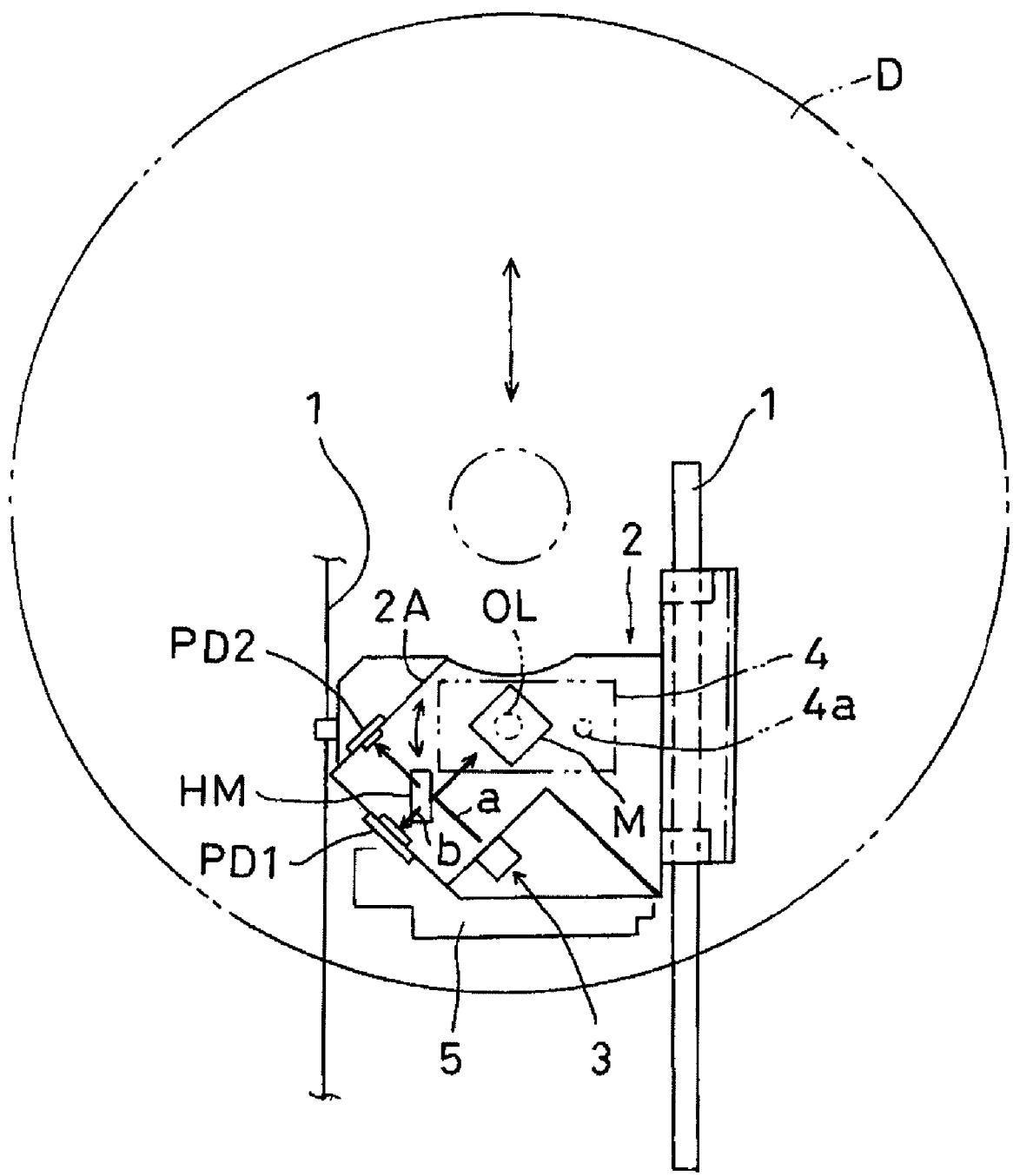
FIG. 6 is a simplified plan view of the optical pickup.
Figure 7:
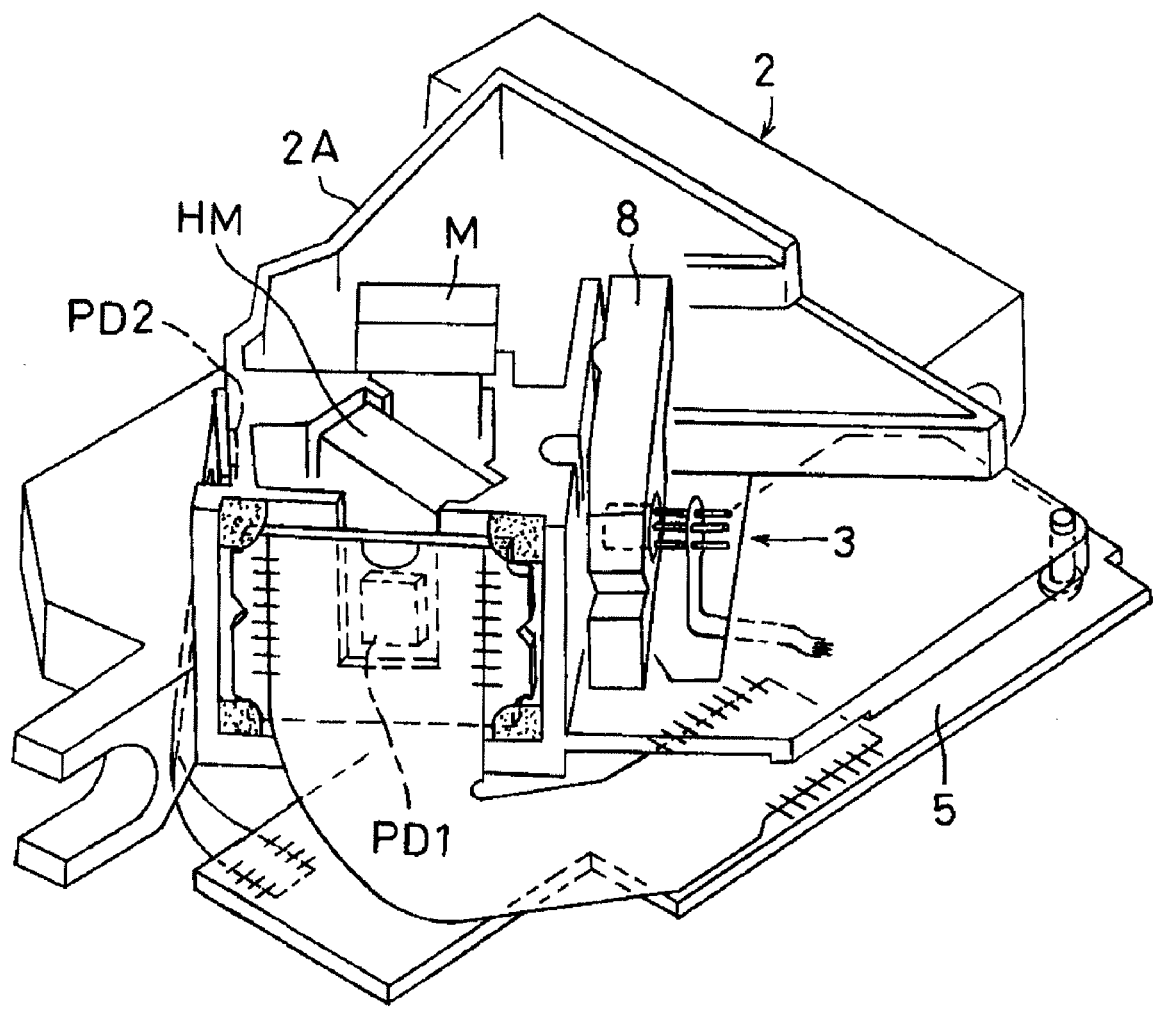
FIG. 7 is a perspective view of the optical pickup.

An optical pickup will be briefly described through reference to FIGS. 1-7. The optical pickup is used in a disk device, such as a DVD recorder, a DVD player, a CD player, etc. As illustrated in FIGS. 6 and 7, the optical pickup includes a sliding base (e.g., support base) 2, a light emitter (e.g., light emitting component) 3, an actuator 4, a main board 5, a reading element PD1, a luminous energy detector PD2, a raising mirror M and a half mirror HM. The sliding base 2 is slidably engaged to guide rails 1 so as to reciprocally move along the guide rails 1. The guide rails 1 are fixedly attached to the disk device and run in a radial direction of a disk D. The sliding base 2 includes a standing frame 2A provided integrally on a front face of the sliding base 2. The light emitter 3, the actuator 4, the reading element PD1, the luminous energy detector PD2, the raising mirror M and the half mirror HM are provided to the standing frame 2A of the sliding base 2. The actuator 4 is equipped with an objective lens OL. The reading element PD1 includes a photodiode. The luminous energy detector PD2 includes a photodiode. The main board 5 includes a printed wiring board provided to a back face of the sliding base 2 that is opposite the front face.

The procedure of reading information will now be described. The disk D is rotated at high speed and the actuator 4 is driven to move the objective lens OL in a focusing direction along a spindle 4a provided to the actuator 4, and to move the objective lens OL in the tracking direction around the spindle 4a. A laser beam "a" from the light emitter 3 is reflected at the half mirror HM and the raising mirror M, passes through the objective lens OL, and is projected onto the disk D. Then, the disk D reflects the laser beam. The reflected light "b" passes through the objective lens OL, is reflected at the raising mirror M, passes through the half mirror HM, and is received at the reading element PD1. The information recorded on the disk D is read based on the received light signal, and the luminous energy of the laser beam "a" is detected by the luminous energy detector PD2. The actuator 4, the reading element PD1, the luminous energy detector PD2, the raising mirror M and the half mirror HM form an optical component that guide the laser beam "a" to the disk D and receive the reflected light "b".

As shown in FIGS. 1 to 4, the light emitter 3 has a laser diode LD, a package 7 and a holder 8. The package 7 holds the laser diode LD. The laser diode LD held in the package 7 is called a CAN package type laser diode. The package 7 has a flange (e.g., flange portion) 7a and a base portion 7b. The flange 7a has a larger diameter than a diameter of the base portion 7b. A positioning recess 12 is formed in an outer peripheral face of the flange 7a. The holder 8 supports the package 7. The holder 8 includes a fitting hole 9 having a large diameter component (e.g., large diameter portion) 9A and a small diameter component (e.g., small diameter portion) 9B concentrically formed with the large diameter component 9A. The holder 8 holds the package 7 in the fitting hole 9. The fitting hole 9 is made in a center of the holder 8. The holder 8 further includes one positioning protrusion 10 and a plurality of (three in this example) fitting protrusions 11. The positioning protrusion 10 and the fitting protrusions 11 are integrally provided with an inner peripheral face of the large diameter component 9A at a specific spacing in a peripheral direction of the large diameter component 9A. The holder 8 is integrally formed as a one-piece, unitary member. An outside diameter L1 of an imaginary circle S that links inner peripheral faces 11a of the fitting protrusions 11 is set to be slightly smaller (such as about 0.01 to 0.05 mm) than an outside diameter L2 of the outer peripheral face of the flange 7a. The fitting protrusions 11 further includes end faces 11b with slopes that extend from an end face 8a of the holder 8 downward towards the center of the fitting hole 9.

As shown in FIGS. 1 to 5, a lateral width k1 of the positioning protrusion 10 is set to be the same as or slightly larger than a lateral width k2 of the positioning recess 12 (k1≧k2). The positioning protrusion 10 includes a main protrusion (e.g., protrusion component) 10e and a guide component 15. The main protrusion 10e extends in an axial direction along the inner peripheral face of the large diameter component 9A from an end face (e.g., a shelf face 9a) of the small diameter component 9B to an end face position 10a that is located at the same height as the end face 8a of the holder 8. The end face 8a of the holder 8 is an end face located on the large diameter component 9A side of the holder 8. The guide component 15 protrudes outward with respect to the main protrusion 10e by a specific height (e.g., first specific height) h1 beyond the end face 8a of the holder 8. The guide component 15 is integrally provided to the main protrusion 10e of the positioning protrusion 10. Outer edges of the end faces 11b of the fitting protrusions 11 are set to be substantially the same height as the end face position 10a of the positioning protrusion 10, so that there is a downward slope toward the center of the fitting hole 9. Inner edges of the end faces 11b is located lower than the end face 8a and the end face position 10a. A plurality of terminals 13 are electrically connected to the ground and the laser diode LD.

The guide component 15 includes a base component 15A and a guide component main body 15B. The base component 15A is formed in a prismatic shape. The base component 15A is formed integrally with the main protrusion 10e of the positioning protrusion 10. The base component 15A extends from the end face position 10a of the positioning protrusion 10. The guide component main body 15B is formed in a truncated pyramidal shape. The guide component main body 15B is formed integrally with the base component 15A and extends from the base component 15A.

As shown in FIGS. 5A, 5B and 5C, side faces 15a and 15b and an inner peripheral face 15c of the base component 15A are formed in-plane with side faces 10b and 10c and an inner peripheral face 10d of the positioning protrusion 10, respectively. The base component 15A is integrally formed with the positioning protrusion 10. The base component 15A protrudes outward by a specific height (e.g., second specific height) h2 beyond the end face 8a of the holder 8.

As shown in FIG. 5, side faces of the guide component main body 15B are formed as tapered faces (e.g., tapered side faces) 15d with a specific inclination angle $\alpha$ with respect to the axial direction of the fitting hole 9. An inner face of the guide component main body 15B is formed as an inclined face (e.g., inner peripheral face) 15e tapered with a specific inclination angle $\beta$ with respect to the axial direction of the fitting hole 9.

An example of specific dimensions will now be described. The lateral width k1 of the positioning protrusion 10 is from 1.1 to 1.2 mm. The lateral width k2 of the positioning recess 12 is 1.1 mm. Thus, if, for example, the lateral width k1 of the positioning protrusion 10 is set to 1.2 mm, then the lateral width k1 of the positioning protrusion 10 is 0.1 mm larger than the lateral width k2 of the positioning recess 12.

The height h1 of the guide component 15 is 0.8 mm. The height h2 of the base component 15A is 0.2 mm. The inclination angles $\alpha$ and $\beta$ of the tapered faces 15d and the inclined face 15e are both 30°.

Figure 1:
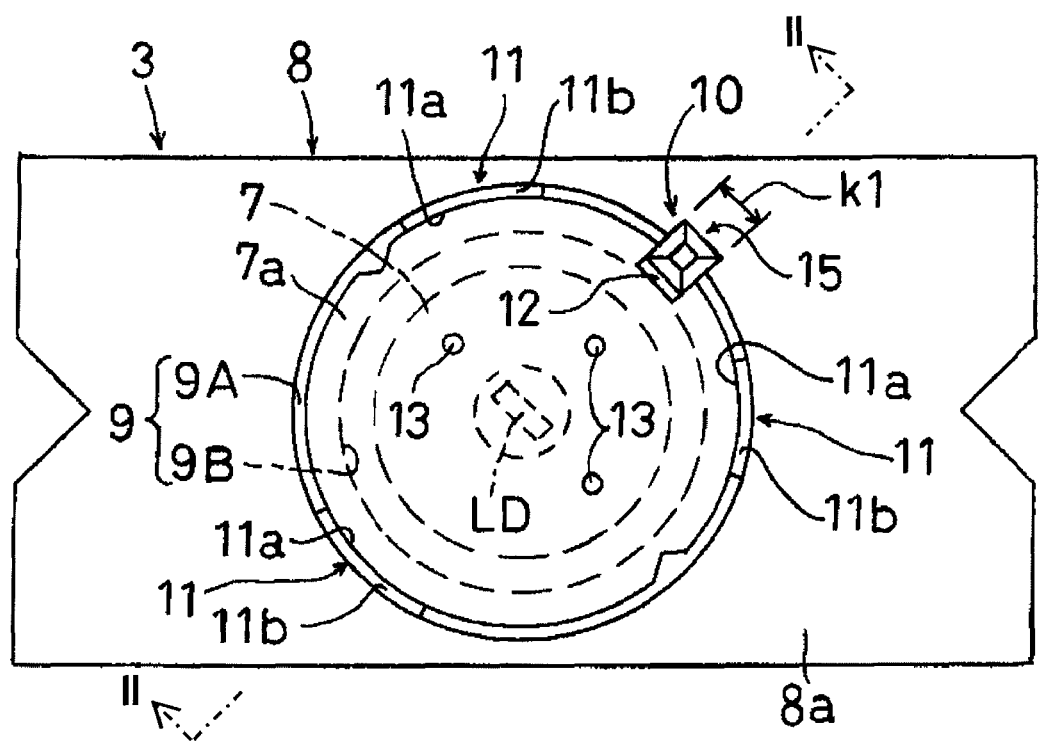
FIG. 1 is a front elevational view of a light emitter of an optical pickup in accordance with one embodiment of the present invention.
Figure 2:
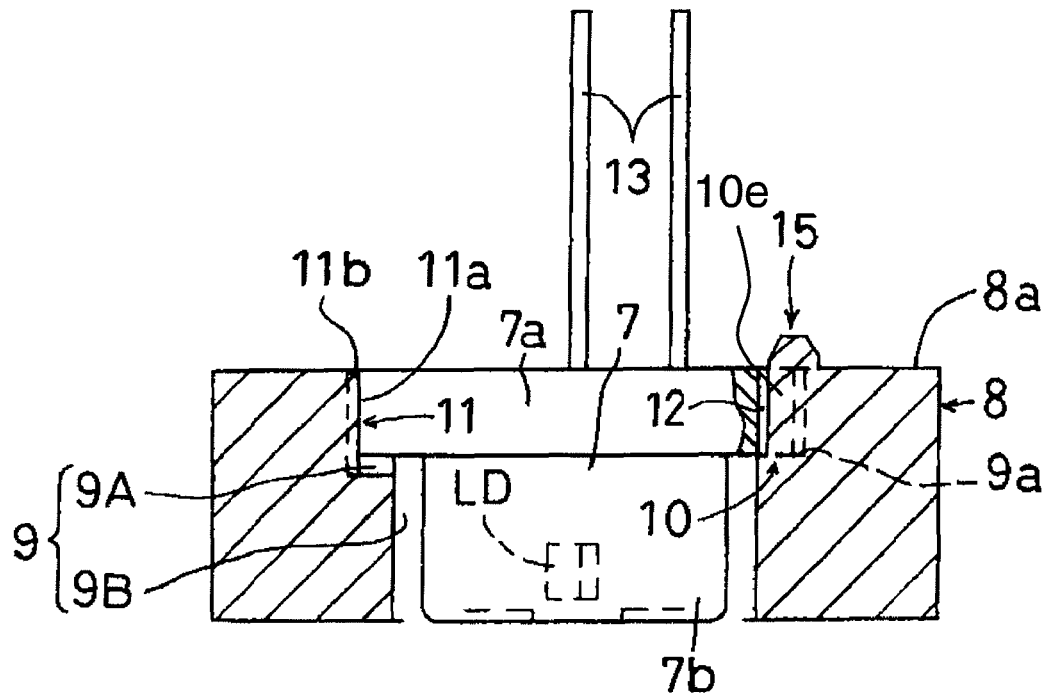
FIG. 2 is a cross sectional view of the light emitter taken along II-II line illustrated in FIG. 1.
Figure 3:
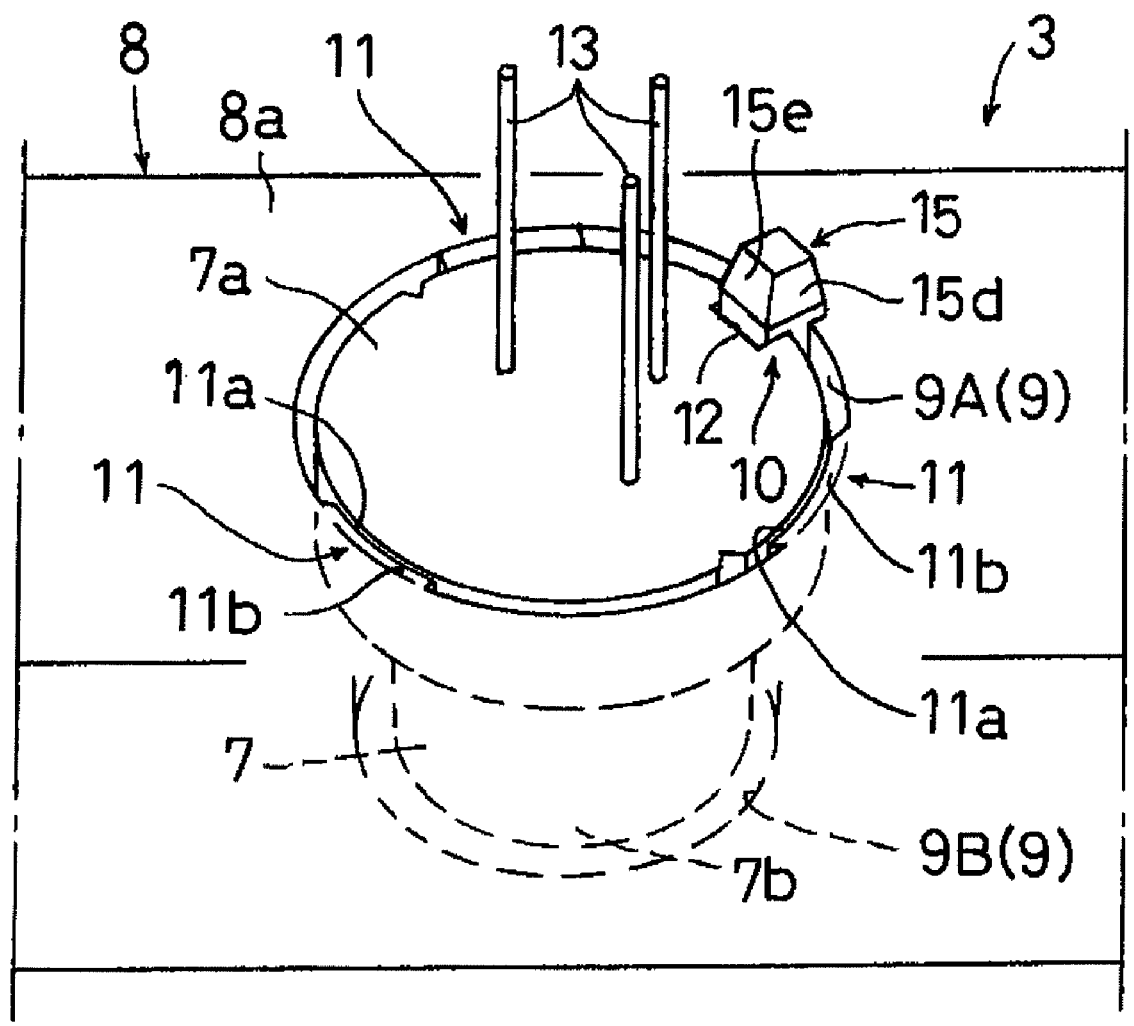
FIG. 3 is a partial perspective view of the light emitter illustrated in FIG. 1.
Figure 4:
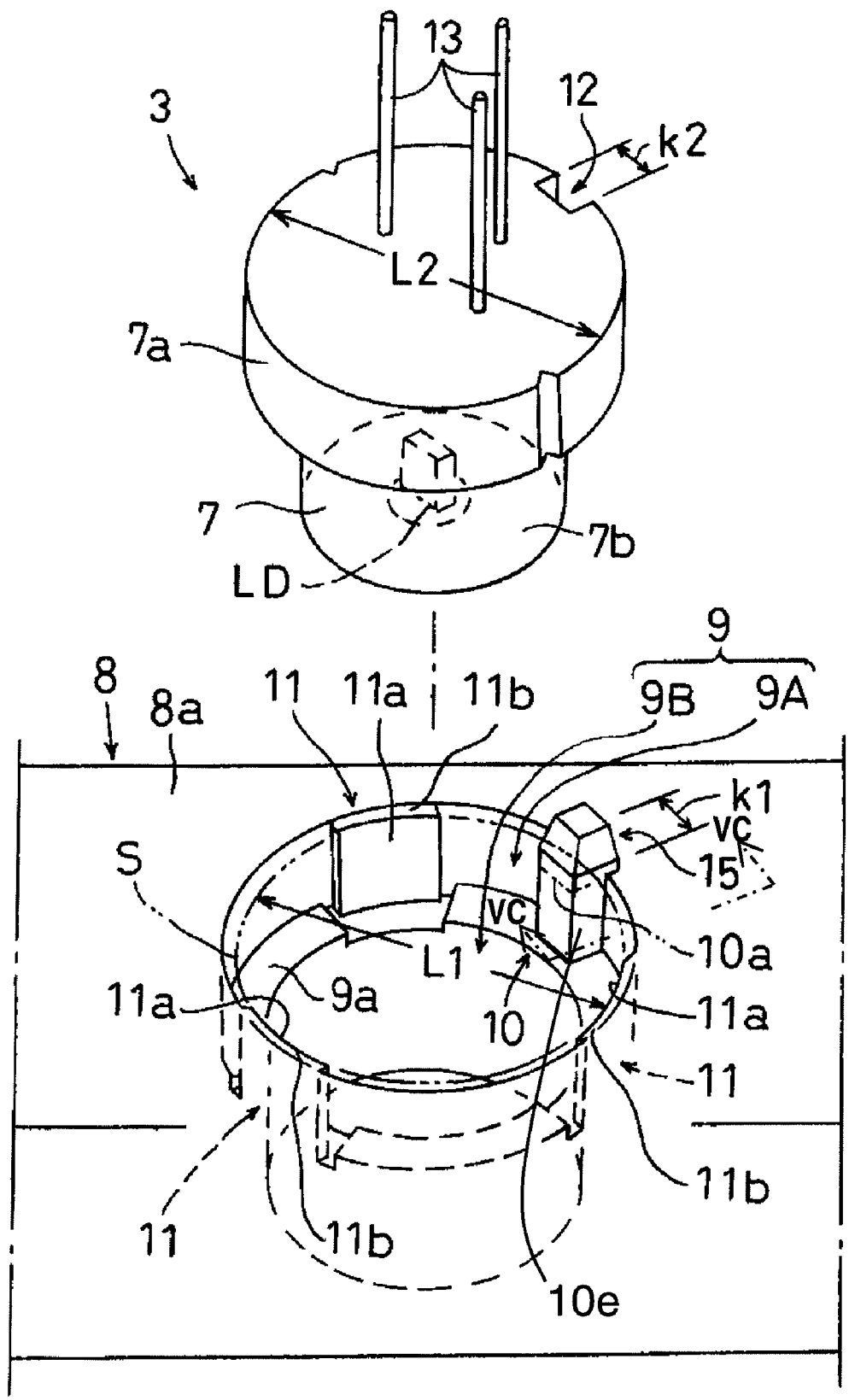
FIG. 4 is an partial exploded perspective view of the light emitter illustrated in FIG. 1.

The assembly procedure will now be described. First, the package 7 is inserted into the fitting hole 9 so that the guide component main body 15B is engaged in the positioning recess 12 of the package 7. Then, the positioning recess 12 is fitted to the base component 15A by sliding along the tapered faces 15d and the inclined face 15e, and the package 7 is correctly positioned with respect to the fitting hole 9. The package 7 is then pushed toward the fitting hole 9. As a result, the flange 7a is press-fitted between the fitting protrusions 11, the main protrusion 10e of the positioning protrusion 10 is fitted into the positioning recess 12, and the flange 7a is placed on the shelf face 9a, as illustrated in FIGS. 2 and 3. Furthermore, the base portion 7b is disposed inside of the small diameter component 9B of the fitting hole 9.

With the light emitter 3, the lateral width k1 of the positioning protrusion 10 of the holder 8 is set to be the same as or slightly larger than the lateral width k2 of the positioning recess 12 of the package 7. Thus, it is difficult to fit the positioning protrusion 10 into the positioning recess 12 if an end face of the positioning protrusion 10 is positioned in-plane with the end face 8a on the large diameter component 9A side of the holder 8 (that is, in a state in which there is nothing that corresponds to the guide component 15).

On the other hands, with the light emitter 3, the guide component 15 that protrudes outward beyond the end face 8a on the large diameter component 9A side of the holder 8 is integrally provided to the main protrusion 10e of the positioning protrusion 10, and the guide component 15 is engaged with the positioning recess 12 of the package 7. Thus, the positioning protrusion 10 can be easily fitted into the positioning recess 12.

The lateral width k1 of the positioning protrusion 10 is set to be the same as or slightly larger than the lateral width k2 of the positioning recess 12. Thus, the inside face of the positioning recess 12 is fitted against the side faces 10b and 10c of the positioning protrusion 10, so that there is zero component clearance between the positioning protrusion 10 and the positioning recess 12. As a result, this solves the problem encountered in the conventional optical pickup wherein the positioning protrusion 10 is irregularly positioned with respect to the positioning recess 12, either in a neutral position, turned to the left, or turned to the right. Thus, the laser diode LD is accurately positioned with respect to the holder 8. Therefore, the laser beam "a" is projected from the laser diode LD, the light "b" reflected by the disk D is polarized, the amount of light received by the reading element PD1 substantially coincides with the setting value, and the signal level is stabilized. As a result, a reading error is prevented and the characteristics of the optical pickup can be kept favorable.

Also, merely by engaging the positioning recess 12 of the package 7 with the guide component main body 15B, the positioning recess 12 is smoothly guided to the base component 15A by sliding along the tapered faces 15d of the guide component main body 15B. As a result, the positioning protrusion 10 can be correctly positioned in the positioning recess 12.

The guide component main body 15B includes the inclined face 15e. Thus, the positioning recess 12 of the package 7 slides along the inclined face 15e, which allows the positioning recess 12 to be guided smoothly to the base component 15A without catching on the guide component main body 15B.

With the light emitter 3, the holder 8 includes the fitting protrusions 11. Thus, high-temperature heat generated by operation of the laser diode LD passes from the package 7, through the fitting protrusions 11, and escapes to the holder 8. As a result, the heat of the laser diode LD is prevented from adversely affecting performance of the optical pickup.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of an optical disk device equipped with the present invention. Accordingly, these terms, as utilized to describe the present invention should be interpreted relative to an optical disk device equipped with the present invention as used in the normal operating position.

While a preferred embodiment has been chosen to illustrate the present invention, it will be apparent to those skilled in the art from this disclosure that various changes and modifications can be made herein without departing from the scope of the invention as defined in the appended claims. Furthermore, the foregoing description of the preferred embodiment according to the present invention is provided for illustration only, and not for the purpose of limiting the invention as defined by the appended claims and their equivalents.

What is claimed is:

1. An optical pickup comprising:
a light emitting component including
a laser diode configured to emit light,
a package housing the laser diode, the package having a positioning recess formed in an outer peripheral face of the package, and
a holder holding the package in a fitting hole of the holder, the holder having a protrusion component that is formed in an inner peripheral face of the fitting hole of the holder with the protrusion component being fitted to the positioning recess of the package to position the package with respect to the holder, and a guide component that extends from the protrusion component such that the guide component protrudes outside of the fitting hole by a first specific height with respect to an end face of the holder with the end face of the holder defining a peripheral edge of an insertion opening of the fitting hole, the protrusion component having a width in a peripheral direction of the fitting hole that is at least equal to a width of the positioning recess of the package in a peripheral direction of the package;
an optical component arranged to guide the light emitted by the light emitting component to a disk and receive the light reflected on the disk; and
a support base arranged to support the light emitting component and the optical component.

2. An optical pickup comprising:
a light emitting component including
a laser diode configured to emit light,
a package housing the laser diode, the package having a positioning recess formed in an outer peripheral face of the package, and
a holder holding the package in a fitting hole of the holder, the holder having a protrusion component that is formed in an inner peripheral face of the fitting hole of the holder and is fitted to the positioning recess of the package to position the package with respect to the holder, and a guide component that extends from the protrusion component such that the guide component protrudes outside of the fitting hole by a first specific height with respect to an end face of the holder that defines a peripheral edge of an insertion opening of the fitting hole, the protrusion component having a width in a peripheral direction of the fitting hole that is at least equal to a width of the positioning recess of the package in a peripheral direction of the package;
an optical component arranged to guide the light emitted by the light emitting component to a disk and receive the light reflected on the disk; and
a support base arranged to support the light emitting component and the optical component,
the holder being integrally formed as a one-piece, unitary member.

3. The optical pickup according to claim 2, wherein
the optical component further includes an actuator having an objective lens through which the light emitted by the light emitting component is projected to the disk, and a reading element being arranged to receive the light reflected on the disk and guided by the objective lens and read information recorded on the disk based on the light received by the reading element.

4. The optical pickup according to claim 3, wherein the support base is arranged to reciprocally slide with respect to the disk in a radial direction of the disk.

5. The optical pickup according to claim 4, wherein the package includes a base portion holding the laser diode, and a flange portion with a larger diameter than a diameter of the base portion, the positioning recess being formed in an outer peripheral face of the flange portion, and
the holder includes the fitting hole having a small diameter portion and a large diameter portion with a larger diameter than a diameter of the small diameter portion, the small and large diameter portions being concentrically arranged, the protrusion component being formed in an inner peripheral face of the large diameter portion.

6. The optical pickup according to claim 5, wherein the holder further has a plurality of fitting protrusions formed in the inner peripheral face of the large diameter portion at locations spaced apart each other, the package being press fitted to the fitting hole of the holder so that the outer peripheral face of the flange portion contacts with inner faces of the fitting protrusions, 7. The optical pickup according to claim 6, wherein the base portion of the package is disposed inside of the small diameter portion of the fitting hole of the holder.

8. A optical pickup comprising:
a light emitting component including
   a laser diode configured to emit light,
   a package housing the laser diode, the package having a base portion holding the laser diode, a flange portion with a larger diameter than a diameter of the base portion, a positioning recess formed in an outer peripheral face of the flange portion, and
   a holder holding the package in a fitting hole of the holder, the holder having a protrusion component that is formed in an inner peripheral face of the fitting hole of the holder and is fitted to the positioning recess of the package to position the package with respect to the holder, and a guide component that extends from the protrusion component by a first specific height beyond an end face of the holder that defines a peripheral edge of an insertion opening of the fitting hole, the protrusion component having a width in a peripheral direction of the fitting hole that is at least equal to a width of the positioning recess of the package in a peripheral direction of the package, the holder being integrally formed as a one-piece, unitary member,
an optical component arranged to guide the light emitted by the light emitting component to a disk and receive the light reflected on the disk, the optical component further including an actuator having an objective lens through which the light emitted by the light emitting component is projected to the disk, and a reading element being arranged to receive the light reflected on the disk and guided by the objective lens and read information recorded on the disk based on the light received by the reading element; and
a support base arranged to support the light emitting component and the optical component, the support base being arranged to reciprocally slide with respect to the disk in a radial direction of the disk,
the holder including the fitting hole having a small diameter portion and a large diameter portion with a larger diameter than a diameter of the small diameter portion, the small and large diameter portions being concentrically arranged, the protrusion component being formed in an inner peripheral face of the large diameter portion, the holder further having a plurality of fitting protrusions formed in the inner peripheral face of the large diameter portion at locations spaced apart each other,
the package being press fitted to the fitting hole of the holder so that the outer peripheral face of the flange portion contacts with inner faces of the fitting protrusions, the base portion of the package being disposed inside of the small diameter portion of the fitting hole of the holder,
the guide component including a base component that integrally extends from the protrusion component by a second specific height beyond the end face of the holder with the base component including side faces and an inner peripheral face formed in-plane with side faces and an inner peripheral face of the protrusion component, respectively, and a guide component main body that is integrally formed with the base component with the guide component main body including tapered side faces inclined with respect to an axial direction of the fitting hole of the holder.

9. The optical pickup according to claim 8, wherein the guide component main body includes an inner peripheral face inclined with respect to the axial direction of the fitting hole of the holder.

10. The optical pickup according, to claim 9, wherein the guide component main body is arranged to engage with the positioning recess of the package to guide the positioning recess of the package along the tapered side faces and the inner peripheral face of the guide component main body when the package is press-fitted to the fitting hole of the holder.

11. An optical pickup comprising:
a light emitting component including
   a laser diode configured to emit light,
   a package housing the laser diode, the package having a positioning recess formed in an outer peripheral face of the package, and
   a holder holding the package in a fitting hole of the holder, the holder having a protrusion component that is formed in an inner peripheral face of the fitting hole of the holder and is fitted to the positioning recess of the package to position the package with respect to the holder, and a guide component that extends from the protrusion component by a first specific height beyond an end face of the holder that defines a peripheral edge of an insertion opening of the fitting hole, the protrusion component having a width in a peripheral direction of the fitting hole that is at least equal to a width of the positioning recess of the package in a peripheral direction of the package;
an optical component arranged to guide the light emitted by the light emitting component to a disk and receive the light reflected on the disk; and
a support base arranged to support the light emitting component and the optical component,
a distal end portion of the guide component having a width in the peripheral direction of the fitting hole that is smaller than the width of the protrusion component.

12. An optical pickup comprising:
a light emitting component including
   a laser diode configured to emit light,
   package housing the laser diode, the package having a positioning recess formed in an outer peripheral face of the package, and a holder holding the package in a fitting hole of the holder, the holder having a protrusion component that is formed in an inner peripheral face of the fitting hole of the holder with the protrusion component being fitted to the positioning recess of the package to position the package with respect to the holder, and a guide component that extends from the protrusion component by a first specific height beyond an end face of the holder, the protrusion component having a width in a peripheral direction of the fitting hole that is at least equal to a width of the positioning recess of the package in a peripheral direction of the package;

an optical component arranged to guide the light emitted by the light emitting component to a disk and receive the light reflected on the disk; and a support base arranged to support the light emitting component and the optical component, the guide component including a base component that integrally extends from the protrusion component by a second specific height beyond the end face of the holder with the base component including side faces and an inner peripheral face formed in-plane with side faces and an inner peripheral face of the protrusion component, respectively, and a guide component main body that is integrally formed with the base component with the guide component main body including tapered side faces inclined with respect to an axial direction of the fitting hole of the holder.

* * * * *